(12) United States Patent
Adams et al.

(10) Patent No.: US 6,586,681 B2
(45) Date of Patent: Jul. 1, 2003

(54) FLAT FLEXIBLE CABLE AND ITS CONNECTION AND CONTACTING

(75) Inventors: Winfried Adams, Sindelfingen (DE); Artur Schubert, Schwarzenbach (AT)

(73) Assignee: I & T Innovation Technik Vertriebe-Ges.m.b.H., Eisenstadt (AT)

( * ) Notice: Subject to any disclaimer, the term of this patent is extended or adjusted under 35 U.S.C. 154(b) by 0 days.

(21) Appl. No.: 09/877,816

(22) Filed: Jun. 8, 2001

(65) Prior Publication Data

US 2003/0056972 A1 Mar. 27, 2003

(30) Foreign Application Priority Data

Jun. 8, 2000 (EP) ............................. 00890189
May 28, 2001 (EP) ............................. 01890163

(51) Int. Cl.⁷ .............................................. H01B 7/08
(52) U.S. Cl. .................... 174/117 F; 439/260; 439/495
(58) Field of Search ...................... 174/117 F, 177 FF; 439/495, 260, 499, 497, 492

(56) References Cited

U.S. PATENT DOCUMENTS

| | | | |
|---|---|---|---|
| 3,728,661 A | | 4/1973 | Kassabgi |
| 4,635,359 A | | 1/1987 | Nozick |
| 4,881,907 A | * | 11/1989 | Bergman et al. ............. 439/111 |
| 5,206,462 A | * | 4/1993 | Iura et al. ................. 174/117 F |
| 5,212,348 A | * | 5/1993 | Gibson ...................... 174/74 R |
| 5,496,182 A | * | 3/1996 | Yasumura .................... 439/62 |

* cited by examiner

Primary Examiner—Chau N. Nguyen
(74) Attorney, Agent, or Firm—Kilpatrick Stockton LLP

(57) ABSTRACT

The invention concerns laminated and extruded flat flexible cable, also called electrical flat conductors, especially its contacting.

The invention is characterized by the fact that stripping (5) of the flat flexible cable occurs in a region that lies at a spacing from the end (7) of flat flexible cable (1).

The invention also concerns embodiments and a matching connector.

5 Claims, 2 Drawing Sheets

FLAT FLEXIBLE CABLE AND ITS CONNECTION AND CONTACTING

FIELD OF INVENTION

The invention concerns flat flexible cable (FFC), both laminated and extruded, and especially with connectors or strip terminals or the like, for electrical contacting according to the introductory part of claim 1.

BACKGROUND OF INVENTION

Laminated electrical flat conductors essentially consist of a flexible support sheet with a preformed conductor set applied on it. The conductor set consists of individual conductor tracks. The individual conductor tracks are individually insulated from each other, i.e., arranged at a spacing relative to each other and have a rectangular cross section with sometimes different dimensions and are therefore also called rectangular conductors. The tops of the conductor tracks are electrically insulated, sheets being used in particular, which are laminated onto the conductors by means of appropriate adhesives, and the bottoms onto the support sheet. Such flexible conductors, called FFC (flexible flat cable) in technical jargon, are used to an increasing degree in automobile manufacture as a replacement for ordinary cable harnesses consisting of round conductors.

Another method for producing extruded flat flexible cable consists of enclosing the conductor tracks by an extrusion process with an electrically insulating sheath, in which the shape and properties of the finished extruded flat flexible cable correspond at least essentially to the shape and properties of the finished laminated flat flexible cable.

Various advantages are gained during use of FFC in contrast to ordinary cable harnesses: by using rectangular conductors as conductor tracks greater amounts of current can be transferred at equal cross-sectional area in comparison with round conductors so that a weight reduction and a reduction in space requirements is obtained, especially in automobile manufacture. The accessibility and especially the flat configuration of such a cable harness are also advantageous, since this type of cable harness can also be mounted behind coverings with limited design depth.

A shortcoming in such flat flexible cables (and in both types) has thus far been the problem of mechanical stability during transport of such flat flexible cables in the state with the insulation removed, since the individual rectangular conductors do not exhibit significant mechanical stability and resist automated handling and electrical connection of such flat flexible cables with circuit boards in control equipment, with other flat conductors or in a transition to ordinary round conductors. The mechanical vulnerability of the stripped rectangular conductors no longer connected via the laminate has also turned out to be inconvenient.

The task of the present invention is to devise an appropriate preparation of flat flexible cables in the contacting area through which simple and reliable transport is also ensured before contacting and reliable and permanent contacting with simultaneous relief of tension and avoidance of damage to the flat cable during handling.

SUMMARY OF INVENTION

According to the invention, the task is solved by the expedients of the characterizing part of claim 1, namely by the fact that removal of the insulation of the flat flexible cable occurs in an area that lies at a spacing from the end of the flat flexible cable. By this expedient, the actual end of the flat flexible cable is retained as a unit and therefore has high mechanical stability and shape retention in comparison with the individual conductor tracks, which significantly facilitates handling during introduction of the conductor track into the connector and at the same time solves the problem of relieving tension on the conductor track.

The invention also concerns a connector for reliable contacting and fixation of such a flat flexible cable which also has tension relief.

This task is solved according to the invention in that the connector in the region of each rectangular conductor being contacted, in which it is not stripped in the end region, has at least one point and/or at least one edge running essentially across the rectangular conductor, which executes a movement toward the rectangular conductor during contacting of the flat flexible cable so that the point or edge contacts through the sheet covering the rectangular conductor on this side and deforms.

In this manner, the tensile forces occurring during operation are directly transferred to the conductor track and sufficient tension relief occurs. By using the connector according to the invention, which jointly contacts several rectangular conductors under practical conditions, even if they are electrically separated from each other, compensation for any tolerance-related, uniform holding forces occurs, since because of the piece of support sheet left on the end of the flat flexible cable and the cover sheet, a mechanical compensation can occur that would be impossible in the individual conductors.

In one embodiment of the invention, the contacts situated in the connector are guided via the points or edges and contact the rectangular conductors in the region in which the two sheets are removed, both from the top and from the bottom. By movement in the region of the point or edge an easy glancing movement occurs with a loop-like design of the contacts on the connector side during locking of the connector so that any contaminants situated on the surface of the rectangular conductor are removed and contacting is improved.

In another embodiment of the invention, it is proposed the components that carry the protrusion or edge and the conductor have on the end facing the flat flexible cable a corrugation running across the direction of the rectangular conductor which contacts the flat flexible cable in the region in which both the support sheet and the cover sheet (or the extruded insulation material) are left, i.e., on the other side of the contact window. Because of this, penetration of dirt and contaminants into the contact region can be reduced and additional fixation of the flat flexible cable occurs in the contact area so that the actual contact surface is shielded mechanically on both sides.

Movement of the component that carries the point or edge and preferably also the contacts and the corrugation can occur in known fashion by cams, wedges or snaps of the housings and is no problem for one skilled in the field of connector design.

In order to prevent a common error that invariably occurs during mounting of connectors on cable ends, especially under the hampered incorporation conditions in automobile manufacture, it is proposed in one embodiment of the invention to arrange the actual connector in a housing and apply hooks laterally to the housing that are pivoted during insertion of the end of the flat flexible cable from the insulation piece that was left right on the end of the cable in a region from 2 to 3 mm and, in so doing, engage behind the end of this insulation piece on the window side and fix its position. Because of the position of these hooks lying at least partially outside of the housing, correct assembly of the flat flexible cable in the connector can be concluded even before it is closed and fixed.

It is proposed in one embodiment of this variant that by pivoting of the two hooks in the assembly position an element that is required for performance in contacting, for example, a locking pin or the like, is released so that the connector can only be closed or the inserted flat flexible cable only fixed when it is correctly and fully inserted into the connector.

It is also possible by the expedient according to the invention to simultaneously contact all conductor tracks or at least a larger number of conductor tracks of a flat flexible cable so that the work time connected with this is shortened, on the one hand, and errors can be avoided, on the other, since correct introduction of the end of the flat flexible cable into the connector can be better controlled and checked, the more bulky and mechanically stable this end is.

The invention also permits simple transition to round cable, since only the individual contacts (pins) of the connector need be connected to corresponding strands of a round cable. The connector can also directly be a part of a circuit board or current consumer.

BRIEF DESCRIPTION OF DRAWINGS

The invention is further explained below with reference to the drawing. In the drawing

DETAILED DESCRIPTION OF PREFERRED EMBODIMENT

Figure 1:
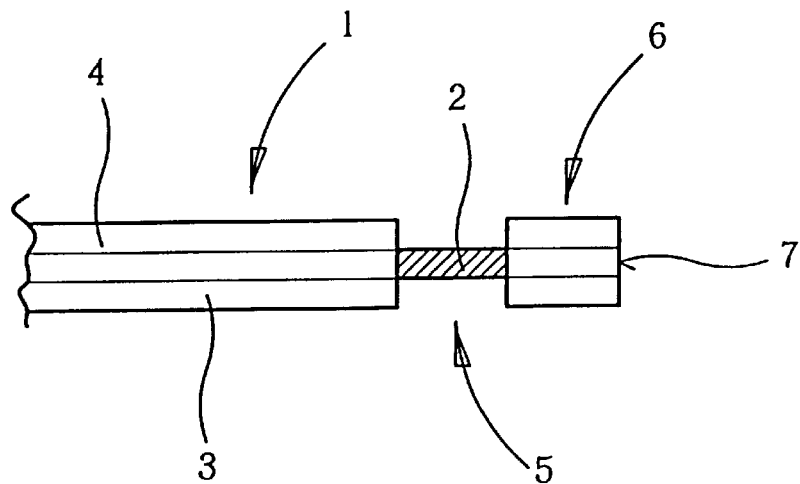
FIG. 1 shows a stripped flat flexible conductor according to the invention in a side view.
Figure 2:
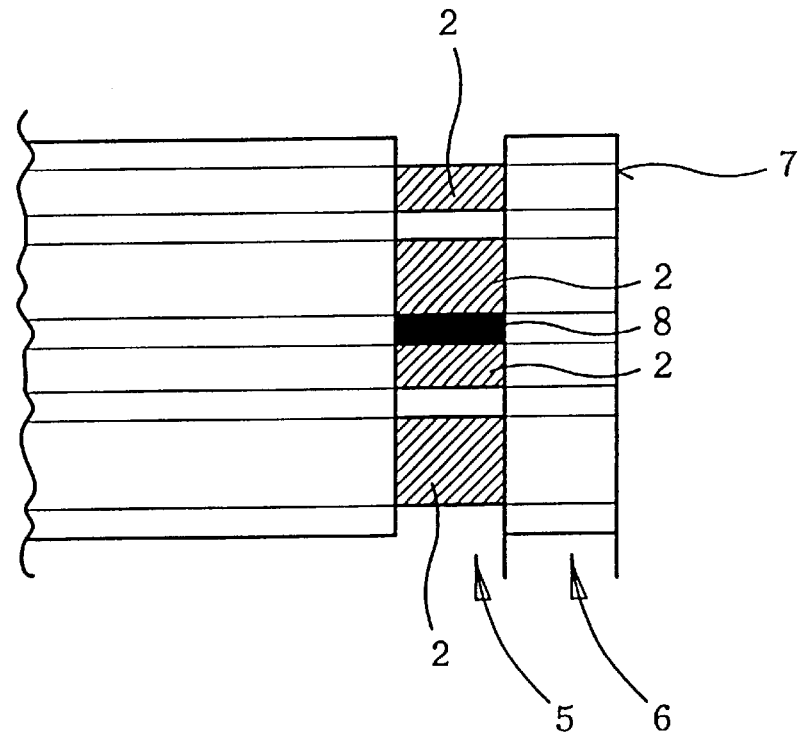
FIG. 2 shows a top view and FIG. 3 shows a schematic view of the connector according to the invention for the stripped flat flexible cable according to the invention.

A stripped flat flexible cable according to the invention is shown in FIGS. 1 and 2. The flat flexible cable in its entirety is denoted 1. It consists of several conductor tracks, also called rectangular conductors that have different width in the depicted practical example (FIG. 2) but the same thickness. The conductor tracks 2 are arranged at a spacing from each other on support sheet 3 so that they are electrically insulated from each other. The insulation is completed by a cover sheet 4, which was laminated onto the support sheet 3 and the conductor tracks 2 by means of an adhesive and/or heating or other joining techniques. As already stated, an extruded flat flexible cable is treated fully analogously for the invention.

According to the invention, at a spacing from the end 7 of the flat conductor, both the support sheet 3 and the cover sheet 4 are entirely removed (if necessary, the entire insulating extrudate) so that only the depicted rectangular conductors 2 of different widths connect the end piece 6 formed by this with the actual flat conductor 1. This piece consisting only of conductor tracks 2 is also referred to as insulation gap with contact window 5.

The thickness of sheets 3 and 4 in the figures is shown highly exaggerated in comparison with the thickness of the conductor tracks 2, but even with consideration of this clarification of the conditions, it becomes clear that the mechanical stability of the contact region 5 in comparison with a stripped flat flexible cable 1 according to the prior art on end 7 is significantly increased. In particular, grasping and handling of the stripped conductor tracks 2 is significantly facilitated by the end piece 6 and this with simultaneously improved protection against any damage during transport of an already stripped flat conductor.

Figure 3:
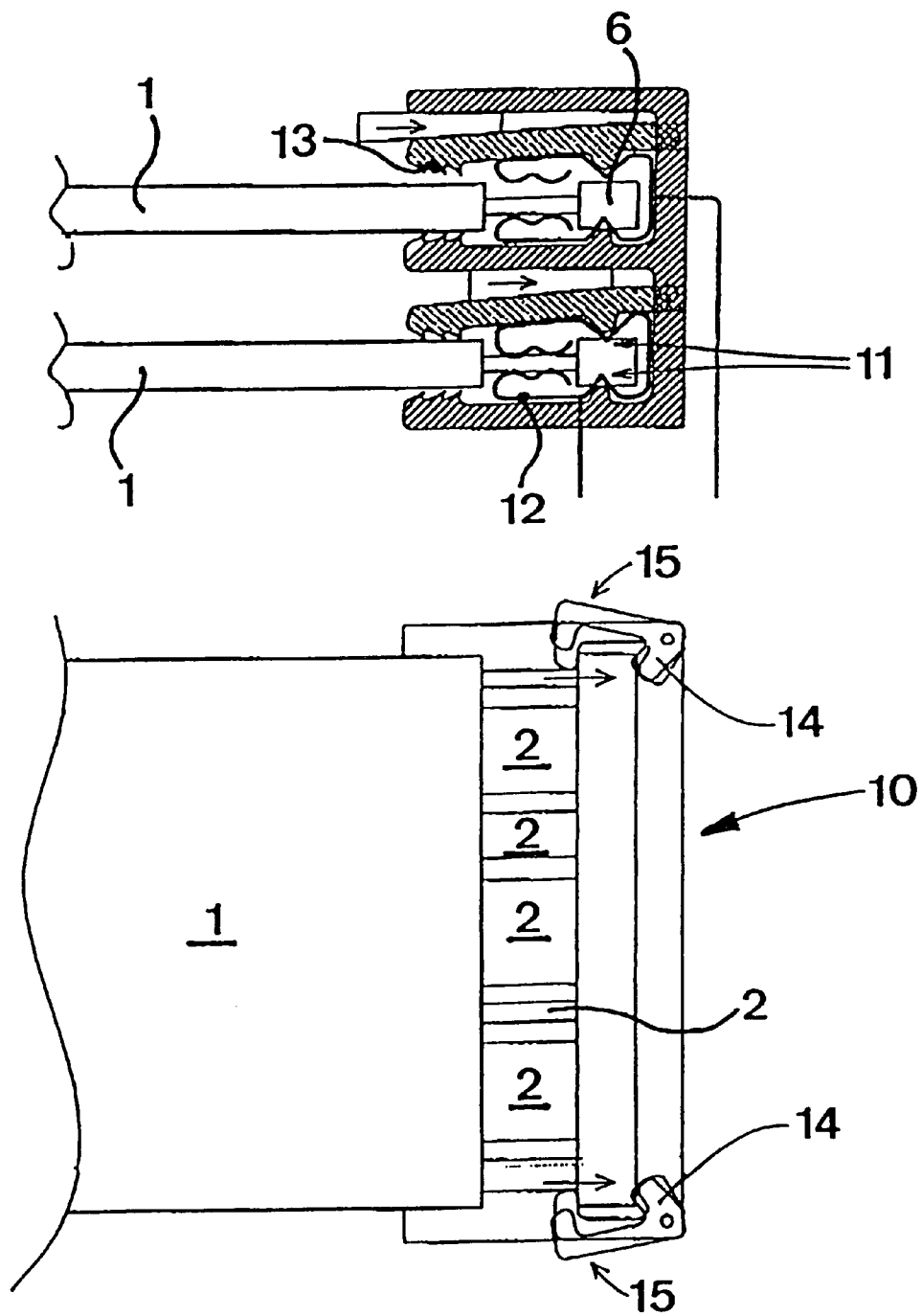

The stripping of the flat conductors according to the invention also permits a significantly improved contacting of these flat conductors or their conductor tracks, for example, by the connectors 10 depicted purely schematically in FIG. 3. This connector has individual contacts that have equidistant spacing from each other, as shown by the schematic section in the uppermost part of FIG. 3. According to the width of the conductor tracks 2 being contacted, two or more of these individual contacts are electrically connected and are thus in a position to transmit together large current intensities without having to devise and use for each current intensity step its own connector or its own contact.

As follows from the middle figure of FIG. 3, a connector 10 that contacts two flat conductors 1 is shown in the depicted practical example, but it is naturally also possible to use or devise a connector that contacts in only one plane.

A connector 10 has a point or edge 11 in its rearmost region (viewed from the flat flexible cable 1), which, during closing of the connector (in principle, any form of grasping of the flat flexible cable and contacting is understood as closing, regardless of whether this actually occurs by closing a multipart housing or, as in the depicted practical example, by inserting retaining wedges or knobs, as usual), penetrate through the support sheet and cover sheet (the entire thickness of the extrudate) up to the actual conductor track 2 in order to deform this conductor track plastically so that mechanical tensile forces are directly transferred by these points or edges 11 to the metallic components of the flat flexible cable.

These points or edges 11 in the depicted practical example are covered by the connector contact 12 and therefore also contribute to contacting, which, however, is not necessary. In the depicted practical example, this variant is advantageous, however, because by closing the connector 10 and because of the loop-like design of the connector contact 12 together with its fixation in the retaining region 6 of flat flexible cable 1 during closing of the connector, a movement of the contact surfaces of the connector contact 12 occurs on the surface of the rectangular conductors 2 and because of this movement any dirt adhering to the rectangular conductors is removed so that metal-metal contacting is reliably ensured.

The connector according to the invention, as shown in FIG. 3, also has on its outermost side i.e., on the side lying next to flat flexible cable 1, components consisting of plastic or other electrically nonconducting material, which during closure of the connector, are brought together, like strips, ribs or indentations 13. These elements contact the sheets 3, 4 (FIG. 1) of the flat flexible cable 1 and readily penetrate into its surface. On the one hand, they ensure the best possible sealing of the contact region from environmental influences and on the other hand tension transfer to the plastic parts of the flat flexible cable 1.

In a special embodiment that can be deduced from the lowermost depiction in FIG. 3, it is apparent that the housing of the connector 10 has hooks on the side, which during insertion of the retaining and insulation part 6 into connector 10 are twisted by stops on the protrusions of hooks 14 so that the actual hook ends go behind the insulation section 6 (viewed in the direction of insertion) and prevent this section from being pulled out, in addition to all the other expedients.

In a variant not shown, closure of the connector 10 is only possible after complete pivoting of hooks 14 in the direction of arrow 15. This can occur, for example, by protrusions, pins, strips, cams or the like, which only come to lie in regions in which the housing of the connector 10 has corresponding recesses that permit closure when complete pivoting of the hooks 15 has occurred.

The invention is not restricted to the depicted practical example but can be modified and altered in different ways. Thus, it is not necessary that the conductor tracks have different widths or that they have the same height, if this is preferable because of simplified contacting in the connectors according to the invention. It is naturally possible to provide more or fewer conductor tracks than shown and it is naturally possible for the overall dimensions to be different than those shown. It is also possible to provide several support and/or cover sheets (or several layers of extrudate) if, for whatever reason, special mechanical stability is desired.

It is essential that right on the end 7 of the flat flexible cable, a region exists over at least most of its width in which at least some of the rectangular conductors 2 are covered on their top and also their bottom by coherent sheets (or enclosed by a common extrudate mass) and that at a spacing from end 7 a region exists in which these rectangular conductors 2 are free of any sheet on the top and/or bottom.

The connector according to the invention can naturally be varied in different ways and it is possible, for example, for connection of flat flexible cables to flat flexible cables, to provide a sort of "double connector" for repair purposes, which is provided on both sides with contacts according to the invention and optionally also with corresponding hooks for both flat flexible cables. Transitions to round cables or directly to circuit boards are naturally also possible without difficulty.

What is claimed is:

1. A connector for contacting of a flat flexible cable with a stripped region for contacting, in which stripping (5) of the flat flexible cable occurs in a region that lies at a spacing from an end (7) of the flat flexible cable (1), so that an insulation piece (6) remains on the cable between the region and the end of the cable and having plural rectangular conductors (2), characterized by the fact that the connector (10) in the region of each of the rectangular conductors (2) to be contacted and in a region of the insulation piece (6) has at least one point or at least one edge (11) extending substantially across a side of the rectangular conductor (2), and the connector is operative to move the point or edge toward the rectangular conductor (2) during contacting of the flat flexible cable (1) so that the point or edge (11) contacts through and deforms the insulating piece (6) remaining on the rectangular conductors (2) on the side so as to transfer mechanical tensile forces by the point or edge to the conductors.

2. The connector according to claim 1, characterized by the fact that the at least one point or edge (11) is covered by a contact (12) of the connector.

3. The connector according to claim 2, to characterized by the fact that the connector contact (12) has a loop shape and has one end fixed adjacent the insulation region (6) of the flat flexible cable contacted by the connector (10) in response to closing of the connector, whereby the loop shape of the connector contact (12) together with its fixation in the insulation piece (6) of the flat flexible cable (1) causes a movement of the contact surfaces of the connector contact (12) to occur on the surface of the rectangular conductor (2) so as to ensure metal—metal contact.

4. The connector according to claim 1, characterized by the fact that the connector has a housing having hooks (15) on a side which during insertion of the insulation piece (6) into the connector (10) are twisted by stops (14) so that ends of the hooks go behind the insulation piece (6) when viewed in the insertion direction.

5. The connector according to claim 4 further comprising engaging elements which the housing of the connector (10) has corresponding recess that permit closure only when complete pivoting of the hooks (15) has occurred.

* * * * *